US011564329B2

(12) United States Patent
Lin et al.

(10) Patent No.: US 11,564,329 B2
(45) Date of Patent: Jan. 24, 2023

(54) HEAT DISSIPATION DEVICE WITH MULTIPLE HEAT DISSIPATION ZONES

(71) Applicant: ASIA VITAL COMPONENTS CO., LTD., New Taipei (TW)

(72) Inventors: Sheng-Huang Lin, New Taipei (TW); Yen-Lin Chu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 17/087,627

(22) Filed: Nov. 3, 2020

(65) Prior Publication Data

US 2022/0141994 A1    May 5, 2022

(51) Int. Cl.
*H05K 7/20* (2006.01)

(52) U.S. Cl.
CPC ..... *H05K 7/20154* (2013.01); *H05K 7/20336* (2013.01); *H05K 7/20418* (2013.01); *H05K 7/2039* (2013.01); *H05K 7/20145* (2013.01)

(58) Field of Classification Search
CPC .......... H05K 7/20136–20154; H05K 7/20727; H05K 7/20336; G06F 1/20
See application file for complete search history.

(56) References Cited

U.S. PATENT DOCUMENTS

| 6,779,595 B1* | 8/2004 | Chiang | H01L 23/467 165/185 |
| 6,883,593 B2* | 4/2005 | Johnson | H01L 23/3672 165/125 |
| 7,036,566 B1* | 5/2006 | Huang | F28D 15/0266 165/104.21 |
| 7,269,010 B2* | 9/2007 | Yu | H01L 23/467 257/707 |
| 7,275,587 B2* | 10/2007 | Kuo | H01L 23/427 165/104.33 |

(Continued)

FOREIGN PATENT DOCUMENTS

| TW | 200638856 A | 11/2006 |
| TW | 201334679 A | 8/2013 |
| TW | M606946 | 1/2021 |

OTHER PUBLICATIONS

Search Report dated Jun. 8, 2021 issued by Taiwan Intellectual Property Office for counterpart application No. 109136288.

*Primary Examiner* — Zachary Pape
(74) *Attorney, Agent, or Firm* — Bradley J. Thorson; DeWitt LLP

(57) ABSTRACT

A heat dissipation device includes a base having a first surface in contact with at least one heat source and an opposite second surface having a heat dissipation zone upward extended therefrom; an auxiliary heat dissipation zone horizontally extended from one of four lateral sides or directions of the heat dissipation zone; an air guiding section defined at the auxiliary heat dissipation zone; and at least one upward indented zone formed between the auxiliary heat dissipation zone and the side of the heat dissipation zone having the auxiliary heat dissipation zone sideward sidewardly extended from a higher portion thereof. With these arrangements, the heat dissipation device can guide air flow currents directly or indirectly to a plurality of heat sources located corresponding to the heat dissipation zone and the auxiliary heat dissipation zone at the same time to cool them.

10 Claims, 9 Drawing Sheets

(56) References Cited

U.S. PATENT DOCUMENTS

2008/0105409 A1\* 5/2008 Luo .................... F28D 15/0275
  165/104.33
2013/0299154 A1\* 11/2013 Lin ...................... H01L 23/427
  165/185

\* cited by examiner

HEAT DISSIPATION DEVICE WITH MULTIPLE HEAT DISSIPATION ZONES

FIELD OF THE INVENTION

The present invention relates to a heat dissipation device applied to electronic devices, and more particularly, to a heat dissipation device capable of guiding air flow currents directly or indirectly to a plurality of heat sources at the same time.

BACKGROUND OF THE INVENTION

There is a large amount of electronic elements mounted in an electronic device, such as a server or a personal computer. These electronic elements produce more heat when the computing performance of the electronic device becomes more powerful. The produced heat is dissipated from the electronic device by providing heat dissipation elements corresponding to heat sources, i.e. the heat-producing electronic elements, so that the heat is not accumulated on the electronic elements and the electronic device is avoided from having an abnormal operating temperature.

Since the electronic device generally has a limited internal space, the heat dissipation elements to be mounted in the small space are largely restricted in terms of their sizes and amounts. To have an upgraded heat dissipation performance, it is preferable all the electronic elements respectively have a corresponding heat dissipation element provided for them. However, since the electronic elements are highly closely arranged in the electronic device, it would not have enough space for mounting a heat dissipation element for each of the electronic elements. Besides, in the event a large amount of heat dissipation elements are to be mounted, they actually might interfere with one another to cause trouble in mounting them.

Further, when a plurality of heat dissipation elements, such as heat sinks and radiating fins, is closely mounted in the electronic device, they might functionally affect one another and even block the air currents in the small internal space of the electronic device from flowing smoothly and accordingly, cause reduced heat dissipation performance. Therefore, excessive heat dissipation elements do not necessarily upgrade the heat dissipation performance. In stead, they would sometimes cause interference with one another to reduce the heat dissipation performance.

FIGS. 1 and 2 are perspective and side views, respectively, of a conventional heat dissipation module 6. The heat dissipation module 6 includes a primary heat sink 61 that is in direct contact with a heat source 7, and a plurality of secondary heat sinks 62 that are connected to the primary heat sink 61 via heat pipes 8. Heat absorbed by the primary heat sink 61 is transferred by the heat pipes 8 to the secondary heat sinks 62, from where the heat is dissipated into surrounding air. The main purpose of the heat dissipation module 6 is to carry away the absorbed heat from the primary heat sink 61 via the heat pipes 8, so that the heat is dissipated at a location remote from the heat source. However, the heat dissipation module 6 so designed occupies a relatively large space, and it could only cool the heat source 7 but not other heat sources in the limited internal space of the electronic device one by one.

Further, the conventional heat dissipation module 6 mainly works with a plurality of fans 9 that are mounted at an air inlet or an air outlet of the heat dissipation system to forcefully suck external air into the system or to forcefully blow internal air out of the system, so as to form forced cooling air convection in the system. Basically, the heat dissipation module 6 is mounted in the system at the position having heat sources in order to provide an increased heat dissipation area and increase the efficiency of cooling the heat sources in the system. For the purpose of further enhancing the performance of the heat dissipation module 6, the latter is divided into the primary heat sink 61 and the plurality of secondary heat sinks 62, so that heat absorbed by the primary heat sink 61 is transferred via heat pipes 8 to the secondary heat sinks 62 located at a remote end to avoid heat accumulation in the primary heat sink 61 and the heat source 7.

In the case the cooling air flow passes through the secondary heat sinks 62 first, the air flow will be partially blocked by the secondary heat sinks 62 and become heated and have a reduced air pressure when it reaches at the primary heat sink 61. In this circumstance, the cooling air flow just could not sufficiently cool the primary heat sink 61 and other electronic elements that are located behind the secondary heat sinks 62. Similarly, in the case the cooling air flow passes through the primary heat sink 61 first, the air flow will be heated at the primary heat sink 61. In this circumstance, the already heated cooling air flow just could not effectively cool other heat sources and the secondary heat sinks 62 that are located behind or at two sides of the primary heat sink 61. Meanwhile, the cooling air flow also has a reduced pressure after it passed the primary heat sink 61. Again, the cooling air flow with reduced pressure could not be effectively guided to other electronic elements and cool the same. Therefore, heat tends to accumulate in the electronic device to cause operating problems.

It is therefore an important target of persons skilled in the art to overcome the drawbacks in the conventional heat dissipation module.

SUMMARY OF THE INVENTION

To effectively solve the problems in the conventional heat dissipation module, it is a primary object of the present invention to provide an improved heat dissipation device, which is able to guide air flow currents to a plurality of heat sources at the same time to carry heat from the heat sources.

To achieve the above and other objects, the heat dissipation device according to the present invention includes a base having a first surface and a second surface defined at a lower and an upper side, respectively. The first surface is in contact with at least one heat source.

A heat dissipation zone is upward extended from the second surface of the base; and an auxiliary heat dissipation zone is horizontally extended from one of a front, a rear, a left and a right side or direction of the heat dissipation zone. An air guiding section is defined at the auxiliary heat dissipation zone, such that an upward indented zone is formed between a lower side of the auxiliary heat dissipation zone and the side of the heat dissipation zone having the auxiliary heat dissipation zone sideward extended from a higher portion thereof. The upward indented zone is located above and in contact with other heat-producing electronic elements, such as resistors, capacitors and memories.

With the heat dissipation device of the present invention, the heat dissipation zone carries away the heat produced by the correspondingly contacted heat source, and the auxiliary heat dissipation zone further provides increased heat dissipation areas. Via the air guiding section defined at the auxiliary heat dissipation zone, a part of the cooling air is guided to the upward indented zone to forcefully carry away the heat produced by other heat sources located within the upward indented zone to achieve the purpose of heat exchange. In brief, the present invention enables the cooling of a plurality of heat sources at the same time with one single heat dissipation device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
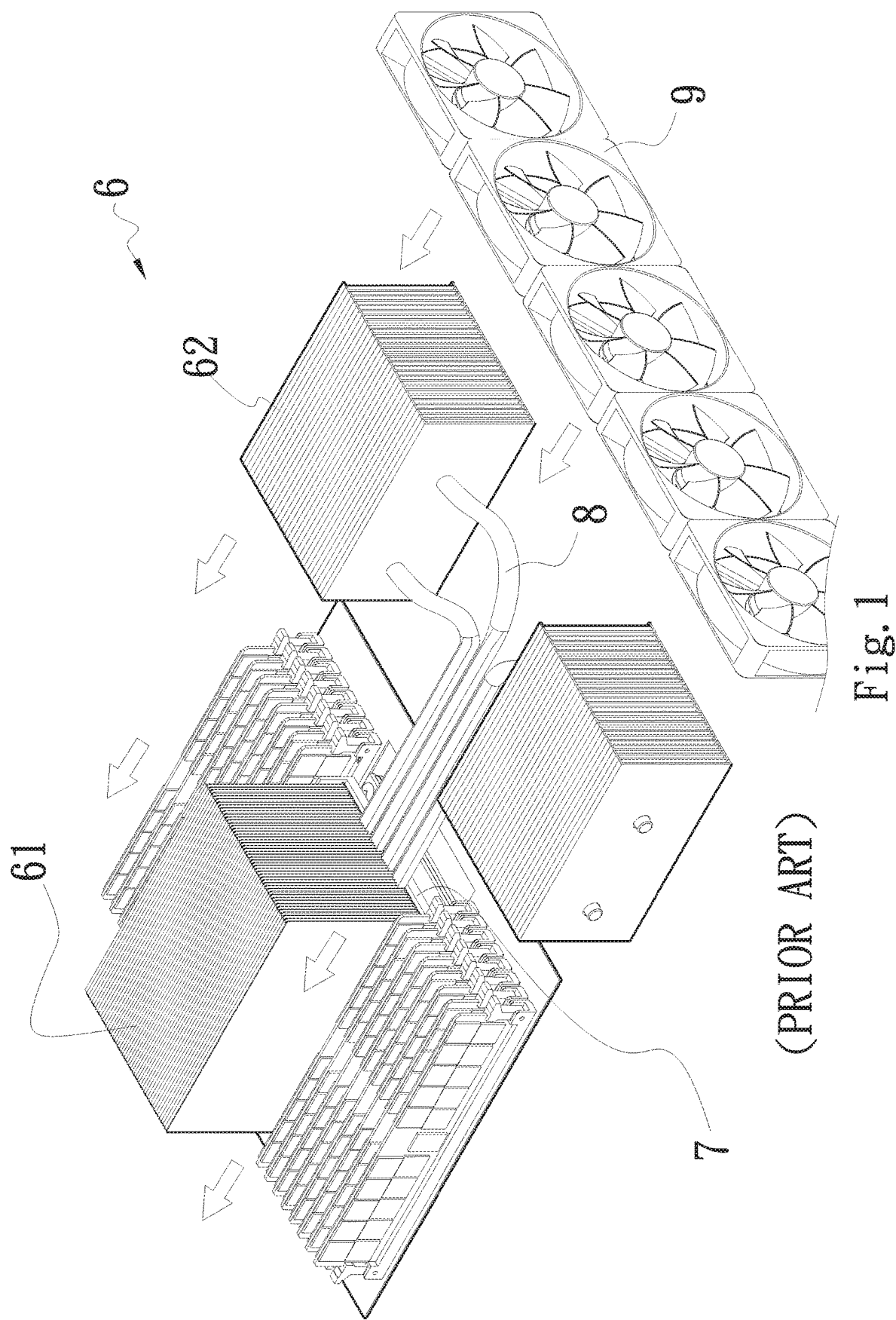
FIG. 1 is a perspective view of a conventional heat dissipation module.
Figure 2:
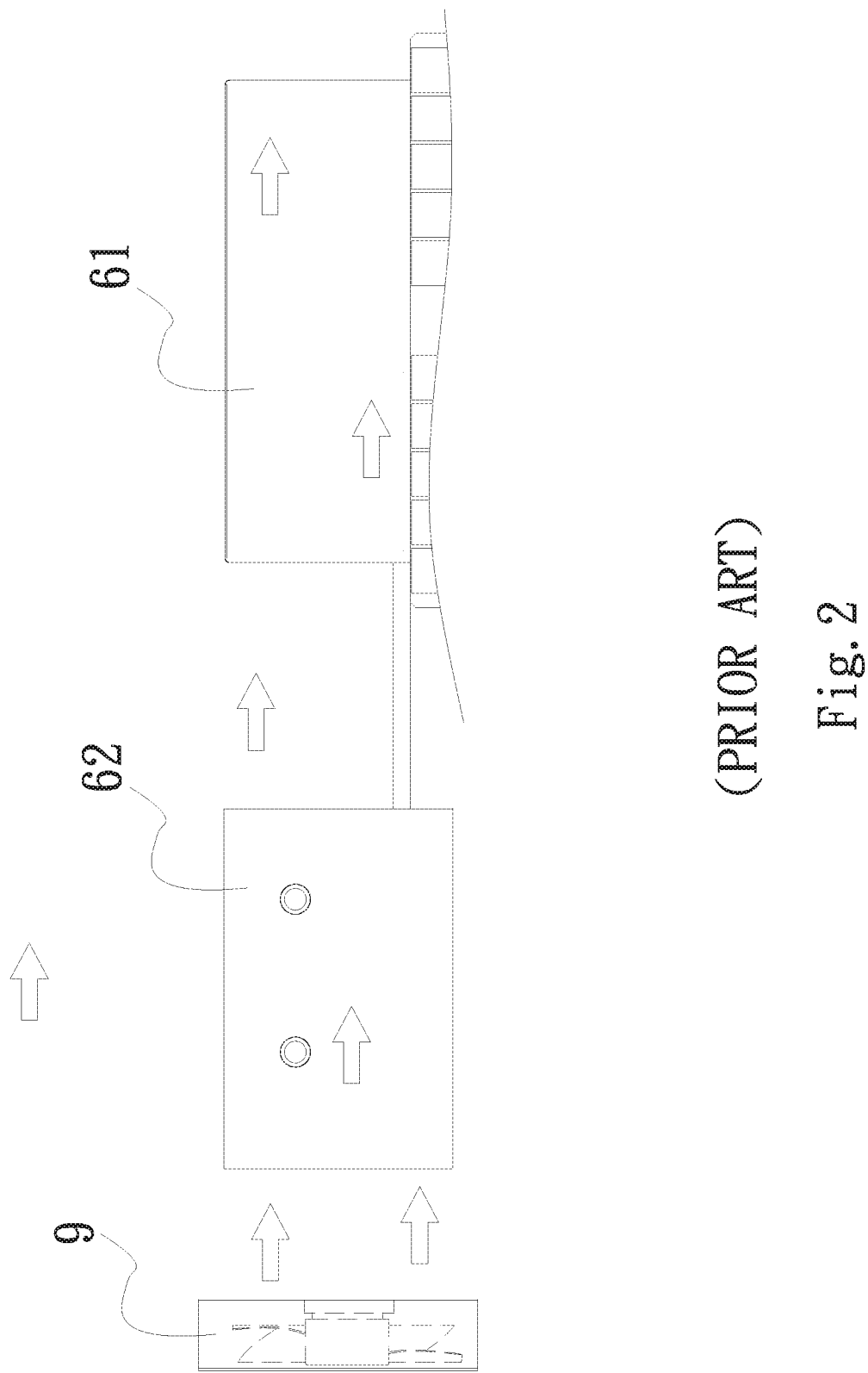
FIG. 2 is a side view of the conventional heat dissipation module of FIG. 1.

The present invention will now be described with some preferred embodiments thereof and by referring to the accompanying drawings. For the purpose of easy to understand, elements that are the same in the preferred embodiments are denoted by the same reference numerals.

Figure 3A:
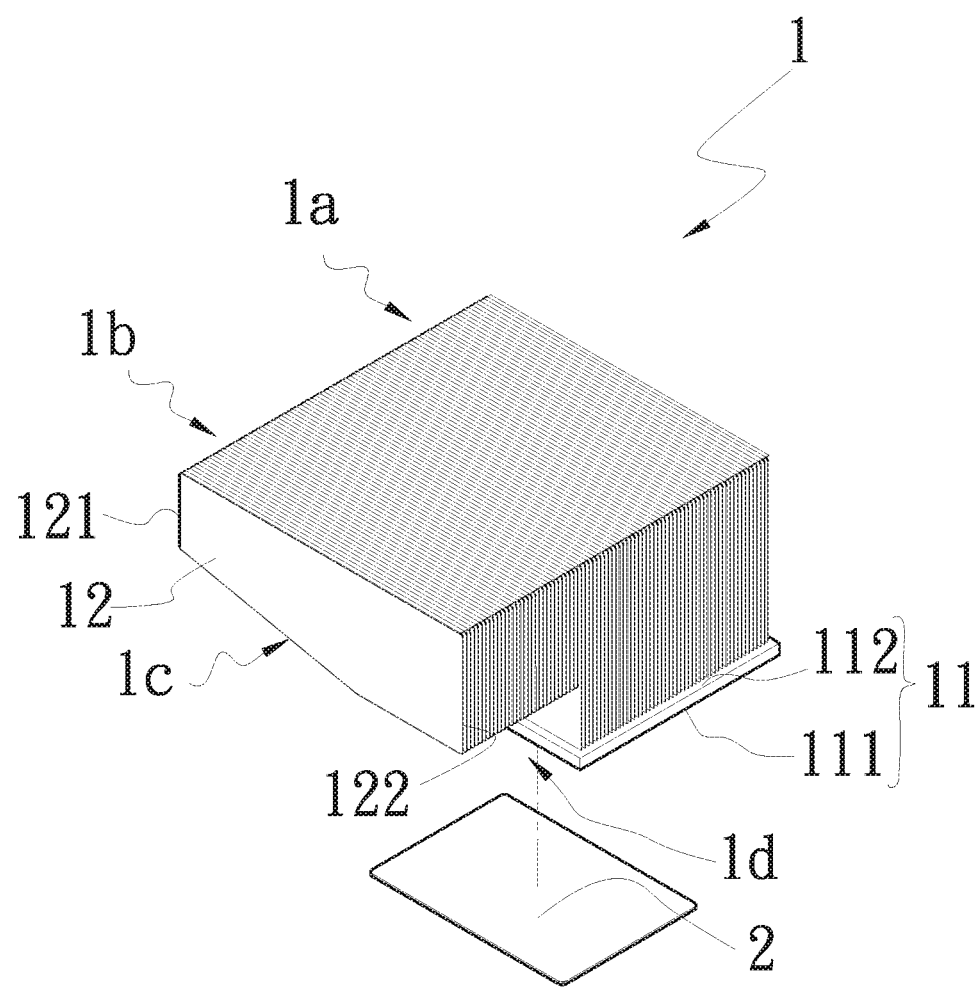
FIG. 3a is an exploded perspective view of a heat dissipation device according to a first embodiment of the present invention, featured by having an air guiding section.

Please refer to FIG. 3a, which is an exploded perspective view of a heat dissipation device 1 according to a first embodiment of the present invention. As shown, the heat dissipation device 1 includes a base 11.

Figure 6:
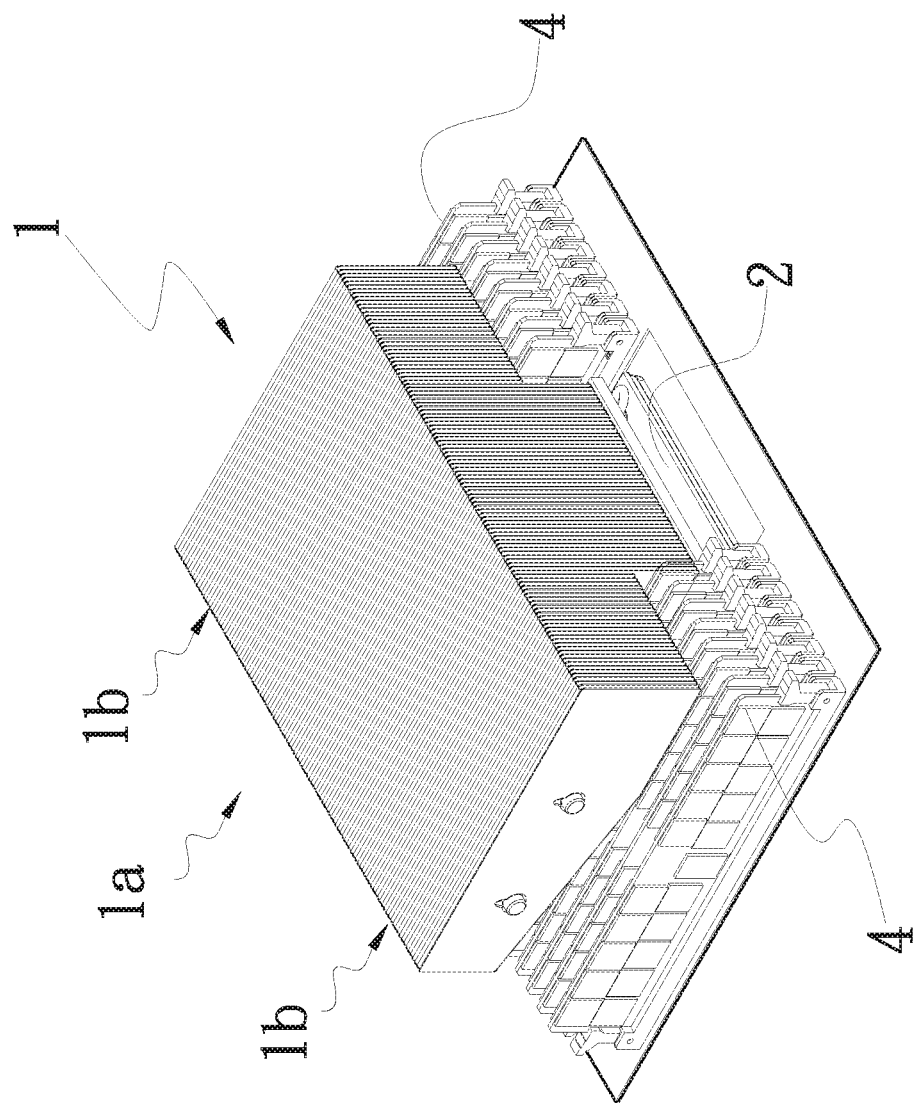
FIG. 6 is an assembled perspective view of a heat dissipation device according to a fourth embodiment of the present invention.
Figure 7:
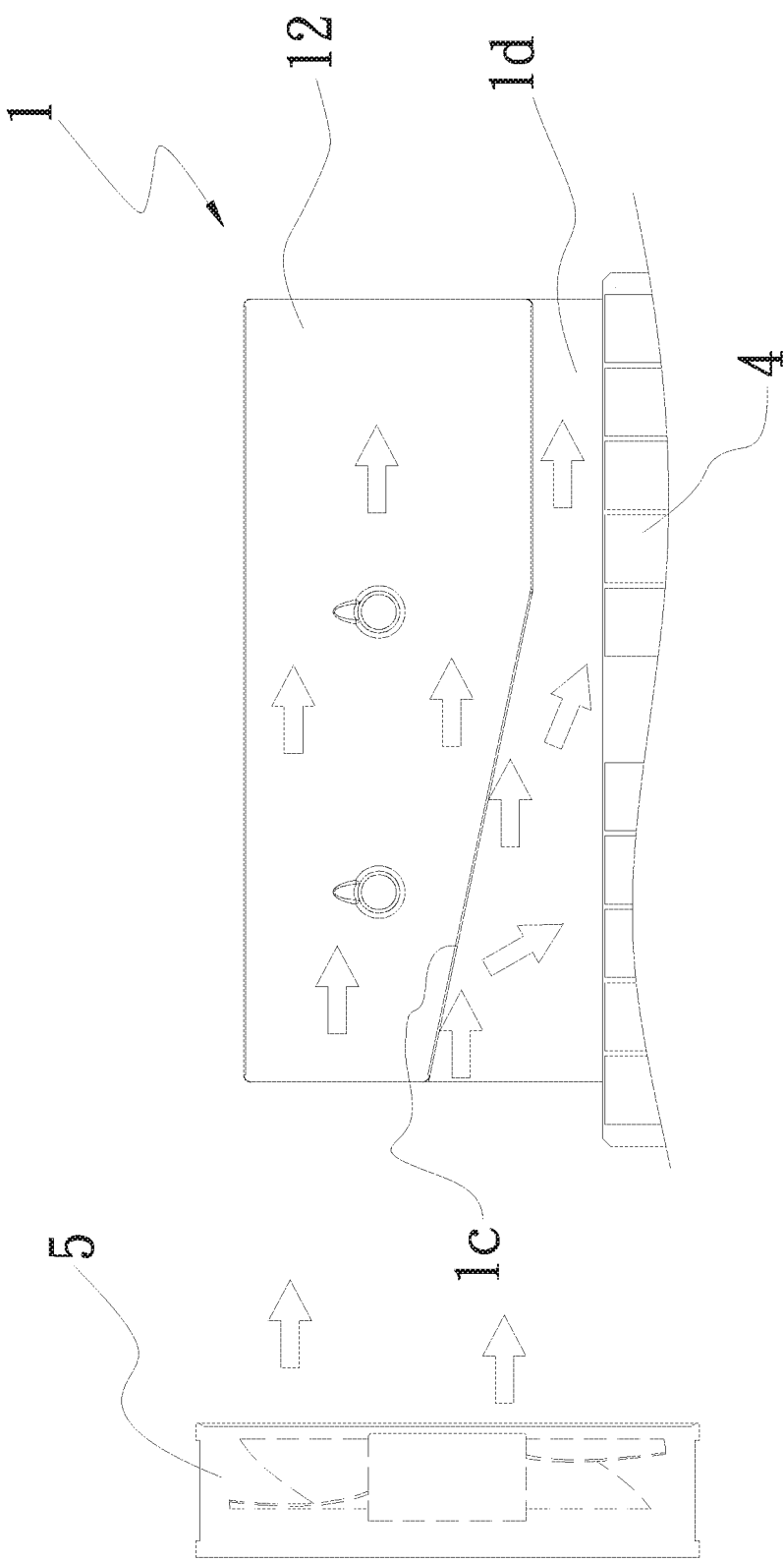
FIG. 7 is a side view of the heat dissipation device according to the fourth embodiment of the present invention.

The base 11 is disposed on a top of a heat source 2 and has a lower and an upper side, which are herein defined as a first surface 111 and a second surface 112, respectively. The first surface 111 is in contact with at least one heat sources 2, and the second surface 112 has a heat dissipation zone 1a upward extended therefrom. At least one auxiliary heat dissipation zone 1b is horizontally extended from one of a front, a rear, a left or a right side or direction of the heat dissipation zone 1a and includes at least one air guiding section 1c. The heat dissipation zone 1a and the auxiliary heat dissipation zone 1b has a height difference between them, so that a space is formed between a lower side of the auxiliary heat dissipation zone 1b and the side of the heat dissipation zone 1a having the auxiliary heat dissipation zone 1b sideward extended from a higher portion thereof, and the space is defined herein as an upward indented zone 1d. As shown in FIGS. 6 and 7, the upward indented zone 1d is correspondingly located on a top of another group of heat sources 4, which may be, for example, memories.

The heat dissipation zone 1a and the auxiliary heat dissipation zone 1b can be respectively an integral heat sink, a plurality of radiating fins 12, or a combination thereof. In the illustrated embodiments of the present invention, the heat dissipation zone 1a is a heat sink and the auxiliary heat dissipation zone 1b is a group of radiating fins 12 assembled together by snapping onto or splicing into one another. The heat sink and the radiating fins can be directly connected to or in indirect contact with one another. Further, the heat dissipation zone 1a and the auxiliary heat dissipation zone 1b can be made of the same or different materials.

The following shows and describes some different configurations of the air guiding section 1c according to the present invention. As shown in FIG. 3a, the radiating fins 12 of the auxiliary heat dissipation zone 1b respectively have two short edges, which are defined as a first end 121 and a second end 122 herein. The first ends 121 and the second ends 122 are parallel to one another. The radiating fines 12 are parallelly arranged in a longitudinal direction and together define the air guiding section 1c below them, and they have a height that gradually increases from the first end 121 toward the second end 122 thereof. Therefore, when viewing from one lateral side of the auxiliary heat dissipation zone 1b, the air guiding section 1c looks like a beveled surface located on a lower side of the auxiliary heat dissipation zone 1b and declined from the first ends 121 toward the second ends 122. Air blown toward the heat dissipation device 1 enters the auxiliary heat dissipation zone 1b via the first ends 121 thereof, and is guided by the beveled air guiding section 1c through the upward indented zone 1d under the auxiliary heat dissipation 1b. Therefore, the upward indented zone 1d forms a tunnel structure capable of guiding the air to flow downwardly.

Figure 3B:
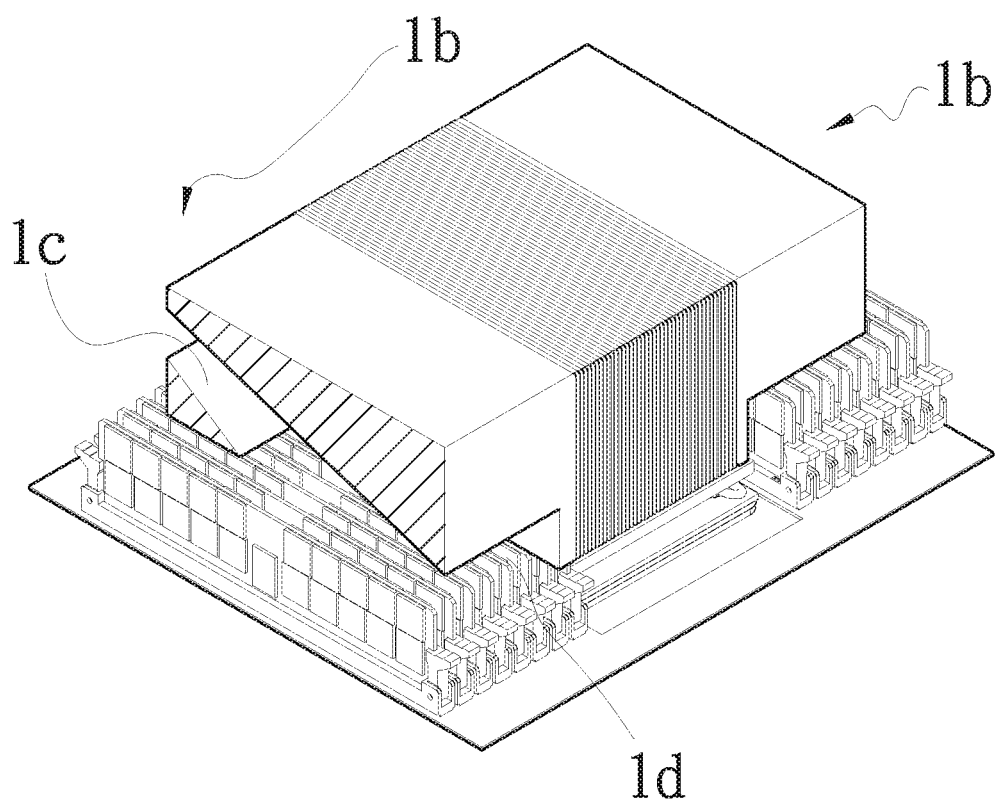
FIG. 3b shows the heat dissipation device of the present invention with a first differently configured air guiding section.

In FIG. 3b, the illustrated heat dissipation device has an air guiding section 1c in another configuration. In this case, the air guiding section 1c functions as an air flow passage and is formed in the auxiliary heat dissipation zone 1b for guiding a cooling air current to flow through the upward indented zone 1d below the auxiliary heat dissipation zone 1b.

Figure 3C:
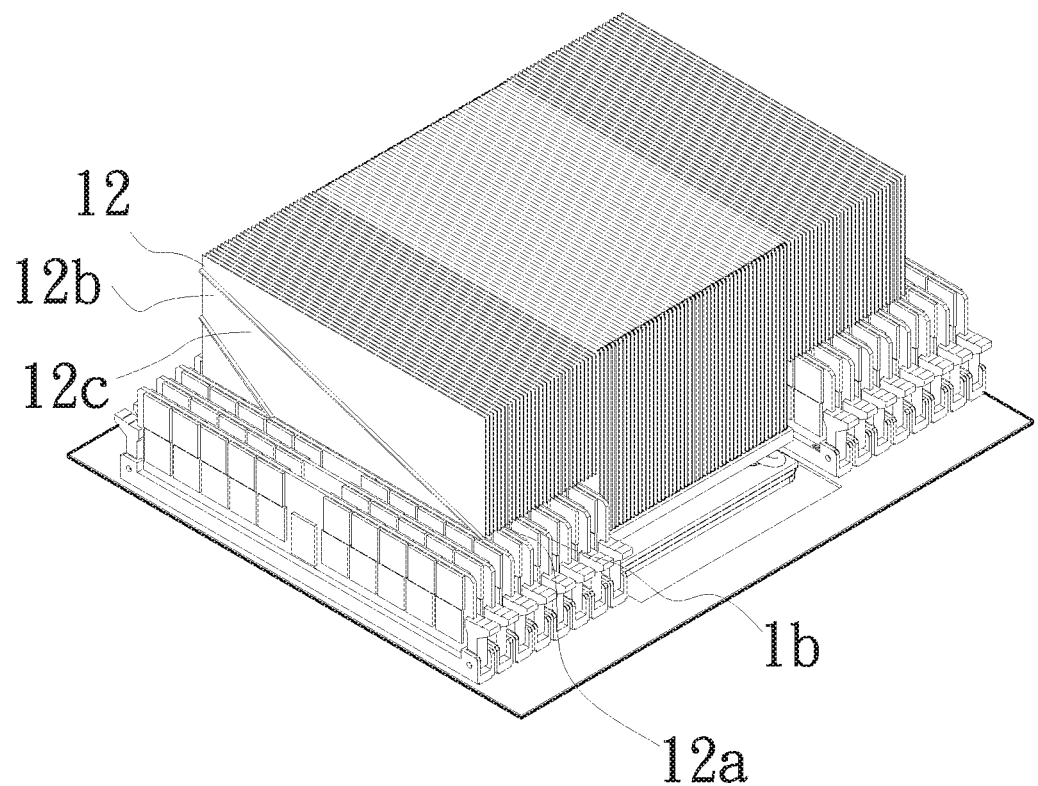
FIG. 3c shows the heat dissipation device of the present invention with a second differently configured air guiding section.

In FIG. 3c, the illustrated heat dissipation device has an air guiding section 1c in a further different configuration. In this case, the auxiliary heat dissipation zone 1b is formed of a plurality of radiating fins 12, which are spaced from one another to form a plurality of spaces 12a among them. The radiating fins 12 are respectively provided on at least one side surface thereof with at least one rib 12b. These ribs 12b and the a plurality of spaces 12a together define a plurality of guiding passages 12c for guiding cooling air currents flowing through the auxiliary heat dissipation zone 1b to also flow to the upward indented zone 1d located below it.

From the above description, it is noted the air guiding section 1c is located above the upward indented zone 1d and, with the upward indented zone 1d, the cooling air currents passing therethrough are not blocked by other electronic elements or heat dissipation means. To form the air guiding section 1c and the upward indented zone 1d, there must be a height difference between the auxiliary heat dissipation zone 1b and the base 11. Then, the auxiliary heat dissipation zone 1b is horizontally extended from one or more of the front, the rear, the left and the right side or direction of the heat dissipation zone 1a, so that the upward indented zone 1d is formed below the auxiliary heat dissipation zone 1b. With the upward indented zone 1d, the auxiliary heat dissipation zone 1b can be located on the top of other electronic elements; and, with the air guiding section 1c defined by the auxiliary heat dissipation zone 1b, more external cooler air from a fan, for example, can be guided to the upward indented zone 1d to carry heat away from the electronic elements within the upward indented zone 1d to achieve the purpose of heat exchange.

In the illustrated embodiment, there is only one auxiliary heat dissipation zone 1b. However, it is understood more than one auxiliary heat dissipation zone 1b can be provided in other operable embodiments.

Figure 4:
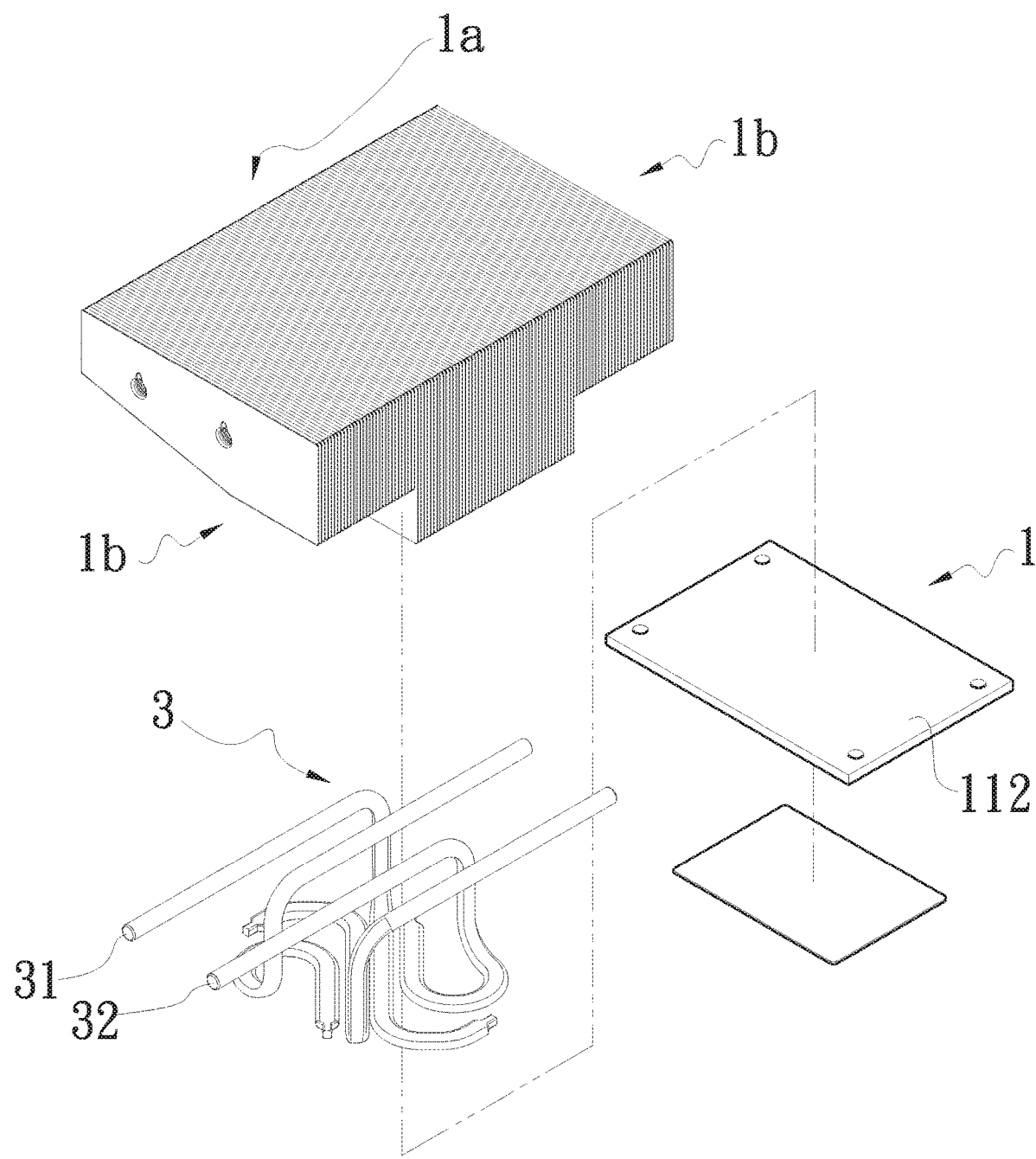
FIG. 4 is an exploded perspective view of a heat dissipation device according to a second embodiment of the present invention.

Please refer to FIG. 4 that is an exploded perspective view of a heat dissipation device 1 according to a second embodiment of the present invention. As shown, the second embodiment is generally structurally similar to the first one. Therefore, the portions that are the same in the two embodiments are not repeatedly described herein. The second embodiment is different from the first one in further having at least one heat pipe unit 3 and more than one auxiliary heat dissipation zone 1b separately formed at a left and a right side of the heat dissipation zone 1a.

The heat pipe unit 3 includes a first heat pipe 31 and a second heat pipe 32, which are extended through the heat dissipation zone 1a and the auxiliary heat dissipation zones 1b. With the heat pipe unit 3, heat absorbed by the heat dissipation zone 1a can be more quickly transferred to the auxiliary heat dissipation zones 1b at two lateral sides thereof for more efficient heat dissipation.

Figure 5:
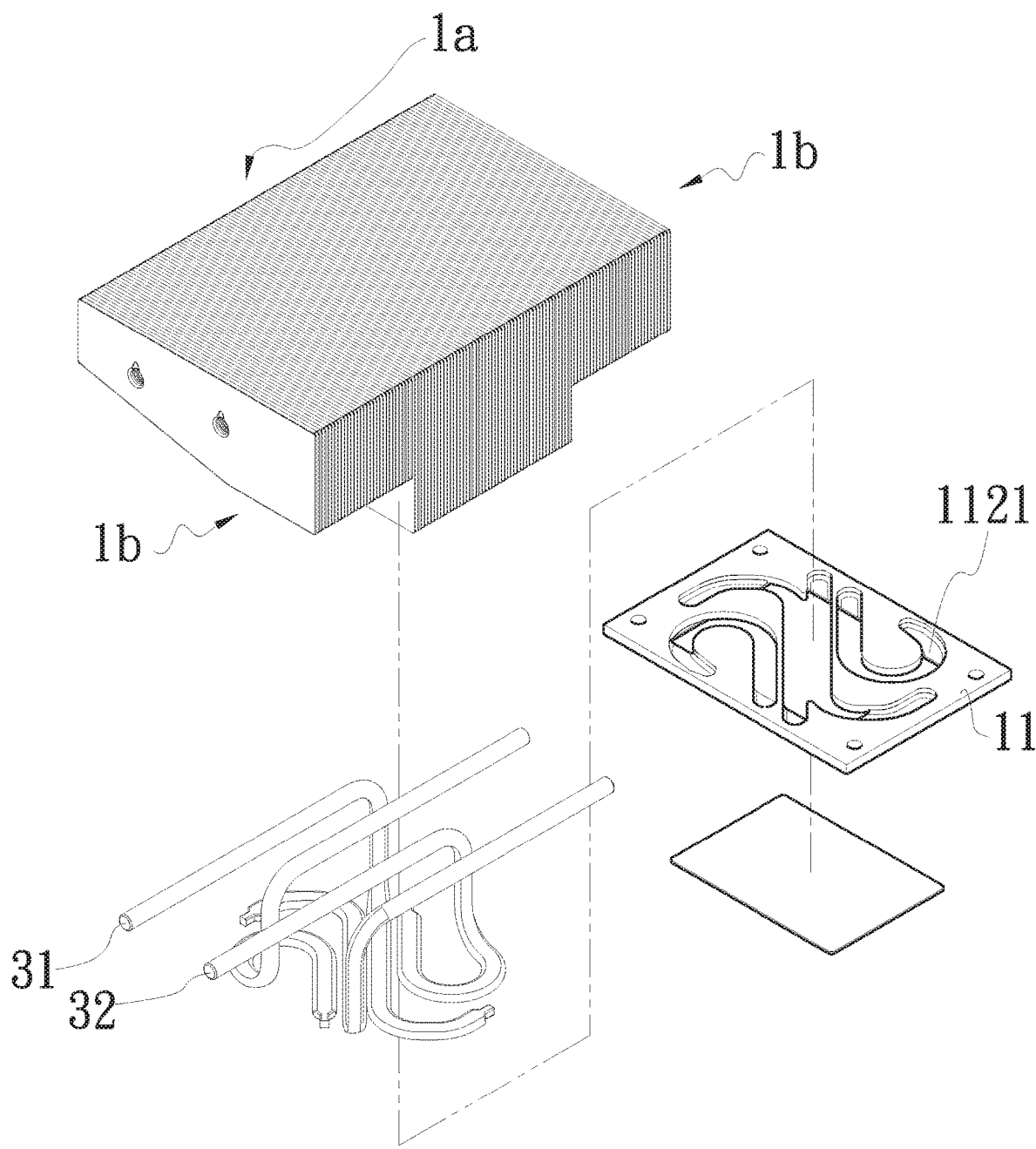
FIG. 5 is an exploded perspective view of a heat dissipation device according to a third embodiment of the present invention.

Please refer to FIG. 5, which is an exploded perspective view of a heat dissipation device according to a third embodiment of the present invention. As shown, the third embodiment is generally structurally similar to the second one. Therefore, the portions that are the same in the second and third embodiments are not repeatedly described herein. The third embodiment is different from the second one in that the base 11 is provided with a plurality of recesses 1121. The first heat pipe 31 and the second heat pipe 32 respectively have an end correspondingly received in the recesses 1121 to lie in the base 11, while their respective another end are extended into the heat dissipation zone 1a and the auxiliary heat dissipation zones 1b.

FIGS. 6 and 7 are assembled perspective and side views, respectively, of a heat dissipation device 1 according to a fourth embodiment of the present invention. Please refer to FIGS. 6 and 7 along with FIGS. 3, 4 and 5. As shown, the heat dissipation device 1 is in contact with a heat source 2 via the base 11. The heat source 2 can be a central processing unit (CPU), a Southbridge chip or a Northbridge chip. Heat produced by the heat source 2 is transferred via the base 11 to the heat dissipation zone 1a and the auxiliary heat dissipation zones 1b, from where the heat is dissipated into the ambient air. There are other heat sources 4, such as memories and transistors, which are located around the heat source 2. The upward indented zones 1d formed below the auxiliary heat dissipation zones 1b at two lateral sides of the heat dissipation zone 1a are located corresponding to other heat sources 4, such as memories, to fitly contact with a top of these heat sources 4. When viewing from one lateral side of the heat dissipation device 1, the air guiding section 1c is in the configuration of a slant surface, which facilitates the guiding of the cooling air to the upward indented zones 1d located below the auxiliary heat dissipation zones 1b. Therefore, cooling air produced by a fan 5 can be guided to different directions and forms a plurality of air currents.

In the conventional heat dissipation device, the adjacent radiating fins define a relatively long air flow passage between them. These relatively long air flow passages not only causes the external air current passing through the heat dissipation device to collide with the radiating fins to cause flow resistance, but also limit the air currents to flow through only the narrow spaces between the radiating fins without the possibility of being guided to other areas to assist in cooling other heat sources. Since the memories are usually closely arranged in a very small internal space of the electronic device, it is difficult to cool the memories by directly providing an individual heat dissipation element for each of the memories.

On the other hand, the heat dissipation device 1 according to the present invention not only has the heat dissipation zone 1a and the auxiliary heat dissipation zones 1b to provide increased heat dissipation areas for the directly corresponding heat source 2, but also has the air guiding section 1c to guide a part of the air flow currents produced by the fan 5 to flow downward into the upward indented zones 1d below the auxiliary heat dissipation zones 1b, forcing the air flow currents to directly carry heat away from other heat sources 4 located within the upward indented zones 1d. That is, the auxiliary heat dissipation zones 1d not only provide increased heat dissipation areas, but also guide the air flow currents to other nearby heat sources 4 to cool them at the same time. The present invention not only achieves the effect of cooling more heat sources 2, 4 with one single heat dissipation device 1, but also solves the problem of being unable to mount multiple heat dissipation devices in the limited internal space of the electronic device.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device, comprising:
    a base having a lower and an upper side respectively defined as a first and a second surface thereof, and the first surface being in contact with at least one heat source;
    a heat dissipation zone upward extended from the second surface of the base;
    at least one auxiliary heat dissipation zone horizontally extended from at least one of four lateral sides or directions of the heat dissipation zone and formed of a plurality of radiating fins, which are parallel to each other and are spaced from one another to form a plurality of spaces among them, each radiating fin at the auxiliary heat dissipation zone having a first lateral side and a second lateral side parallel to the first side, the first lateral side and the second lateral side being two short sides of each radiation fin, an area of the each radiation fin gradually extended and increased from the first lateral side to the second lateral side;
    an air guiding section defined at the at least one auxiliary heat dissipation zone, the air guiding section being a beveled surface when viewing from a direction from the at least one auxiliary heat dissipation zone to the heat dissipation zone, such that a tunnel structure is formed below the at least one auxiliary heat dissipation zone for guiding cooling air flow currents to flow downward; and
    at least one upward indented zone formed between a lower side of the at least one auxiliary heat dissipation zone and the side of the heat dissipation zone having the auxiliary heat dissipation zone sideward extended a higher portion thereof, wherein the beveled surface guides cooling air flow currents to flow through the at least one upward indented zone located below the at least one auxiliary heat dissipation zone.

2. The heat dissipation device as claimed in claim 1, further comprising at least one heat pipe unit, each of which including a first heat pipe and a second heat pipe; and wherein the base is provided with a plurality of recesses; and the first heat pipe and the second heat pipe respectively having an end correspondingly received in the recesses to lie in the base and another end extended into the heat dissipation zone and the at least one auxiliary heat dissipation zone.

3. The heat dissipation device as claimed in claim 1, further comprising at least one heat pipe unit, each of which including a first heat pipe and a second heat pipe; and the first and the second heat pipe being extended through the heat dissipation zone and the at least one auxiliary heat dissipation zone.

4. The heat dissipation device as claimed in claim 1, wherein the heat dissipation zone and the at least one auxiliary heat dissipation zone can be made of the same or different materials.

5. The heat dissipation device as claimed in claim 1, wherein the at least one auxiliary heat dissipation zone is located corresponding to at least one heat source.

6. A heat dissipation device, comprising: a base having a lower and an upper side respectively defined as a first and a second surface thereof, and the first surface being in contact with at least one heat source; a heat dissipation zone upward extended from the second surface of the base; at least one auxiliary heat dissipation zone horizontally extended from at least one of four lateral sides or directions of the heat dissipation zone and formed of a plurality of radiating fins, which are spaced from one another to form a plurality of spaces among them; an air guiding section defined at the at least one auxiliary heat dissipation zone; and at least one upward indented zone formed between a lower side of the at least one auxiliary heat dissipation zone and the side of the heat dissipation zone having the auxiliary heat dissipation zone sideward extended a higher portion thereof, allowing an air current flowing therethrough, wherein the radiating fins are disposed in a direction parallel to a direction of the air current, and wherein the radiating fins are respectively provided on at least one side surface thereof with at least one rib; these ribs and the plurality of spaces together defining a plurality of guiding passages for guiding cooling air currents to flow through the at least one upward indented zone located below the at least one auxiliary heat dissipation zone.

7. The heat dissipation device as claimed in claim 6, further comprising at least one heat pipe unit, each of which including a first heat pipe and a second heat pipe; and wherein the base is provided with a plurality of recesses; and the first heat pipe and the second heat pipe respectively having an end correspondingly received in the recesses to lie in the base and another end extended into the heat dissipation zone and the at least one auxiliary heat dissipation zone.

8. The heat dissipation device as claimed in claim 6, further comprising at least one heat pipe unit, each of which including a first heat pipe and a second heat pipe; and the first and the second heat pipe being extended through the heat dissipation zone and the at least one auxiliary heat dissipation zone.

9. The heat dissipation device as claimed in claim 6, wherein the heat dissipation zone and the at least one auxiliary heat dissipation zone can be made of the same or different materials.

10. The heat dissipation device as claimed in claim 6, wherein the at least one auxiliary heat dissipation zone is located corresponding to at least one heat source.

* * * * *